US011289813B2

(12) United States Patent
Teneh et al.

(10) Patent No.: US 11,289,813 B2
(45) Date of Patent: Mar. 29, 2022

(54) COMPACT ANTENNA DEVICE

(71) Applicant: Elta Systems Ltd., Ashdod (IL)

(72) Inventors: Nimrod Teneh, Herzliya (IL); Benyamin Almog, Givat Brener (IL)

(73) Assignee: ELTA SYSTEMS LTD., Ashdod (IL)

(*) Notice: Subject to any disclaimer, the term of this patent is extended or adjusted under 35 U.S.C. 154(b) by 672 days.

(21) Appl. No.: 16/204,812

(22) Filed: Nov. 29, 2018

(65) Prior Publication Data
US 2019/0207313 A1    Jul. 4, 2019

(30) Foreign Application Priority Data

Dec. 28, 2017 (IL) .......................................... 256639

(51) Int. Cl.
*H01Q 7/06* (2006.01)
*H01Q 7/00* (2006.01)
*H04B 5/00* (2006.01)
*H01Q 21/28* (2006.01)
*H01Q 1/48* (2006.01)
*H01Q 1/50* (2006.01)
(Continued)

(52) U.S. Cl.
CPC .................. *H01Q 7/06* (2013.01); *H01Q 1/48* (2013.01); *H01Q 1/50* (2013.01); *H01Q 7/005* (2013.01); *H01Q 21/28* (2013.01); *H04B 5/0081* (2013.01); *G01R 33/34007* (2013.01); *G01R 33/34053* (2013.01); *G01R 33/3628* (2013.01)

(58) Field of Classification Search
CPC .. H01Q 7/06; H01Q 1/48; H01Q 1/50; H01Q 7/005; H01Q 21/28; G01R 33/34007; H04B 5/0081
See application file for complete search history.

(56) References Cited

U.S. PATENT DOCUMENTS 5,298,910 A     3/1994  Takei et al.
6,025,813 A *   2/2000  Hately .................... H01Q 7/00
                                                  343/741
(Continued)

FOREIGN PATENT DOCUMENTS

DE      2502376 A1    7/1976
GB       921950 A     3/1963
(Continued)

OTHER PUBLICATIONS

"Rec. ITU-R P.372-9", pp. 4-7 and 15-16.
(Continued)

*Primary Examiner* — Dameon E Levi
*Assistant Examiner* — Jennifer F Hu
(74) *Attorney, Agent, or Firm* — Dorsey & Whitney LLP

(57) ABSTRACT

The present invention relates to an antenna device including an integrated matching circuit being implemented by at least one controllable capacitor for a number of frequencies. The at least one controllable resonating capacitor determines a resonance frequency of the antenna device. An object of the invention is to provide a compact antenna device which can obtain a desired matching characteristic without using a separate matching circuit which limits miniaturization of the antenna system as a whole and forms a factor of limiting the efficiency of the antenna and raising cost when the antenna is incorporated into the terminal.

14 Claims, 5 Drawing Sheets

(51) Int. Cl.
*G01R 33/36* (2006.01)
*G01R 33/34* (2006.01)

(56) References Cited

U.S. PATENT DOCUMENTS

| | | | |
|---|---|---|---|
| 6,144,346 A * | 11/2000 | Boy | H01Q 7/005 343/841 |
| 6,342,856 B1 | 1/2002 | Nakano et al. | |
| 6,407,702 B1 | 6/2002 | Bergman et al. | |
| 7,969,372 B2 | 6/2011 | Miyashita et al. | |
| 2005/0128154 A1* | 6/2005 | Hately | H01Q 9/14 343/725 |
| 2009/0179812 A1 | 7/2009 | Nakamura et al. | |
| 2009/0309788 A1 | 12/2009 | Welsh | |
| 2010/0188308 A1 | 7/2010 | Honda et al. | |
| 2010/0213770 A1* | 8/2010 | Kikuchi | H02J 5/005 307/104 |
| 2011/0285596 A1* | 11/2011 | Krupa | H01Q 7/00 343/748 |
| 2011/0309994 A1* | 12/2011 | Kato | H01P 1/20345 343/860 |
| 2014/0062817 A1* | 3/2014 | Ishizuka | H04B 1/3827 343/745 |

FOREIGN PATENT DOCUMENTS

| | | |
|---|---|---|
| GB | 2274953 A | 8/1994 |
| JP | 2002518683 A | 6/2002 |
| WO | 03007422 A1 | 1/2003 |

OTHER PUBLICATIONS

"TI: Conditions for unambiguous source location using polarization diverse arrays", pp. 1365-1369.
Almog, "Chapter 2: Equivalent Circuits; Chapter 3: Detailed Design and Chapter 4: Low Inductance Windings", Maritime IIF DF Antenna Element—Intermediate Report, 2006, 12 pages.
Balanis, "Linear Wire Antennas", Antenna Theory, Wiley, New York., 2007, 16 pages.
Balanis, "Multiple Antenna Design Parameters", Modern Antenna Handbook; Wiley, New York., 2008, Section 22.2.2.
Bergman, et al., "LOIS as Radio Observatory Interferometry with 3D Vector Sensors", 6th LOIS Workshop Vaxjo, Sweden, Nov. 2004, 3 pages.
Hatke, "Performance analysis of the superCART antenna array", Image Project Rep. AST-22; MIT Lincoln Lab; Lexington, MA, Mar. 1992.
Kennedy, "Loop Antenna Measurements", IRE Transactions on Antenna and Propagation, Oct. 1956, pp. 610-618.
Park, et al., "Chapter 6: Receiving Antennas", Antenna HDBK, pp. 6-16 to 6-18.
Pettengtll, et al., "Receiving Antenna Design for Miniature Receivers", IEEE Transactions on Antenna and Propagation, Jul. 1977, pp. 528-530.
Rhode & Schwartz, "Antennas HF-VHF/UHF-SHF Catalog", 2006/2007, pp. 18-19.
Smith, et al., "Antenna Polarization and Polarization Synthesis", excerpt from "Circular Polarization in F-M Broadcasting," Electronics, Sep. 1948, vol. 21.
Smith, "Loop Antennas", Antenna Engineering Handbook, 1984, pp. 5-6 to 5-8.
Wheeler, "Small Antennas", IEEE Transactions on Antenna and Propagation, Jul. 1975, pp. 462-469.

* cited by examiner

COMPACT ANTENNA DEVICE

TECHNOLOGICAL FIELD

The present invention relates to a compact magnetic antenna device.

BACKGROUND

It is well known that the electrical efficiency of antennas, whose maximum dimensions are a small fraction of the wavelength, tends to be poor. Moreover, the instantaneous bandwidth of electrically small antennas tends to be relatively narrow so that continuous tuning is often required to establish resonance of the antenna at the frequency of operation. Thus, wide instantaneous bandwidth, high efficiency, and compactness tend to be conflicting requirements in the antenna art.

A small loop (circular or square) is equivalent to an infinitesimal magnetic dipole whose axis is perpendicular to the plane of the loop. That is, the fields radiated by an electrically small circular or square loop are of the same mathematical form as those radiated by an infinitesimal magnetic dipole. In other words, the field pattern of electrically small antennas of any shape (circular, elliptical, rectangular, square, etc.) is similar to that of an infinitesimal dipole with a null perpendicular to the plane of the loop and with its maximum along the plane of the loop. Loop antennas with electrically small circumferences or perimeters have small radiation resistances that are usually smaller than their loss resistances. Thus, they are very poor radiators, and they are rarely employed for transmission in radio communication. When they are used in any such applications, it is usually in the receiving mode, such as in portable radios and pagers, where antenna efficiency is not as important as the signal-to-noise ratio. They are also used as probes for field measurements and as directional antennas for radiowave navigation. The radiation resistance of the loop can be increased, and made comparable to the characteristic impedance of practical transmission lines, by increasing (electrically) its perimeter and/or the number of turns. If the loop antenna has N turns wound so that the magnetic field passes through all the loops, the radiation resistance is equal to that of single turn multiplied by $N^2$. Another way to increase the radiation resistance of the loop is to insert, within its circumference or perimeter, a ferrite core of very high permeability which will raise the magnetic field intensity and hence the radiation resistance. This forms the so-called ferrite loop.

GENERAL DESCRIPTION

Generally, the impedance of an antenna is the real resistance and imaginary reactance that appears at the terminals of the antenna. Because there are inductive and capacitive characteristics of an antenna, they will change with frequency. Objects that are nearby, such as other antennas, the components on a circuit board, and users of the device, will also affect impedance. Any antenna exhibits a complex impedance $Z(f)$ as seen from the antenna terminals where: $Z(f)=Rr(f)+jX(f)$ where Rr is the radiation resistance of the antenna and jX is its reactance. An antenna will have two types of resistance associated with it. Radiation resistance converts electrical power into radiation. Ohmic resistance is loss on the antenna's structure that converts electrical power into heat. The radiation resistance should be much higher than the Ohmic resistance, though both are important to the antenna's transmission line matching efficiency. The reactance is power that is stored in the near field of the antenna. This reactance, combined with the real resistance, makes up the antenna's impedance. Both values are affected by objects in the near field and will vary down the antenna's length. These resistance and reactance values are important because maximum power transfer will occur when the source and load impedances match. If they are different, called a "mismatch," then some of the power sent to the antenna will be reflected back into the transmitter's output and lost as heat. This will lower the efficiency of the system, shorten the range, increase the power required for a given range, and shorten battery life.

Impedance matching is an essential part of antenna design. The input impedance of an antenna needs to be reasonably close to the amplifier impedance (e.g. 50 Ohm), otherwise the signal is reflected back to the amplifier and not radiated by the antenna. Matching is particularly needed before any practical application for a small/compact antenna, defined as $a<\lambda$ where $\lambda$ is the wavelength range of operation and a the dimension of the antenna, because it has an input impedance consisting of large reactance and small radiation resistance. A matching network including one or more elements may be constructed externally to the antenna for cancelling the reactance and increasing the input resistance to about 50 Ohm. The antenna is then tuned at the matched frequency. However, the matching network has disadvantages. Adding reactance to the whole antenna system increases the Q factor, thus lowering the bandwidth. Moreover, loss in the matching network lowers efficiency.

For example, the antenna may have a radiation resistance of about 1 Ohm and an Ohmic resistance of about 0.1 Ohm. Therefore, the antenna resistance has a total value of about 1.1 Ohm. If the antenna is directly connected to a transmission line, the majority of the signal would be reflected back. To match an impedance of about 50 Ohm, several parameters may be increased. First, the antenna's length may be increased. However, the requirements of compactness would not be respected. The number of turns may also be increased. However, the increasing of the number of turns increases the Ohmic resistance but increases also the parasitic capacitance. Additionally or alternatively, a ferrite core of very high permeability may be inserted which raises the magnetic field intensity and hence the radiation resistance. However, insertion of the ferrite core also increases parasitic capacitance, lowering efficiency of the antenna. The present invention provides a compact magnetic antenna device having a small size as compared to the wavelength range of operation (e.g. typical size of about a hundredth of the electromagnetic wavelength), and relative high efficiency. The present invention overcomes the above-mentioned problems by providing a magnetic antenna device comprising at least one magnetic antenna unit having primary and secondary antenna modules. The secondary antenna module is configured as a radiating antenna element of the antenna unit and the primary module is configured as a feeding circuit for the secondary antenna module, such that the primary module generates a magnetic field in a direction co-aligned with the winding, thereby providing that the primary module is coupled to the secondary antenna module for feeding the secondary antenna module. Therefore, according to a broad aspect of the present invention, there is provided a magnetic antenna device comprising at least one magnetic antenna unit. The magnetic antenna unit comprises a secondary module having a secondary inductance configured as a radiating antenna element of the antenna unit, and comprising one or more radiating sets, each comprising a serially connected winding coil and respective controllable capacitor, whereby each radiating set is connected to the ground from both ends thereof, and a primary module having a primary inductance configured as a feeding circuit for the secondary module and comprising one or more feeding sets, each comprising a respective winding coil being connected at one end to a feeding port of the antenna device, and at the other end, to the ground, such that the primary module generates a magnetic field in a direction co-aligned with the winding; thereby providing that the primary module is coupled to the secondary module for feeding the secondary module. A ratio between the primary and the secondary inductances of the feeding sets and of the radiating sets corresponds to a ratio between impedances of the radiating sets and of the feeding sets. The winding coils of the primary and secondary modules are arranged such that the antenna device has an impedance matched to an impedance of a transmission line to be connected to the feeding port.

To achieve the requirements of compactness, the circumference or perimeter of the antenna unit is thus small. The dimensions of the winding coil of the radiating sets and of the feeding sets are significantly smaller than an operational wavelength of the antenna unit, thereby resulting in impedances of the feeding sets being substantially lower than a transmission impedance associated with an impedance of a transmission line to be connected to the feeding port. If the winding coil of the radiating sets and of the feeding sets has a substantially identical cross-sectional surface, a ratio between impedances of the radiating sets and of the feeding sets corresponds to a square of the number of turns of the winding coil of the radiating sets and of the feeding sets ratio. If the winding coil of the radiating sets and of the feeding sets does not have a substantially identical cross-sectional surface, a ratio between impedances of the radiating sets and of the feeding sets corresponds to a square of the number of turns factored by the surface ratio of the winding coil of the radiating sets and of the feeding sets ratio. The distance between the primary module and secondary module may be selected such that the antenna device has an impedance matched to an impedance of a transmission line to be connected to the feeding port. The transmission of energy is performed efficiently and in a relatively compact arrangement. In some embodiments, the antenna unit has a dimension of about $\lambda/100$ where $\lambda$ corresponds to the wavelength of operation. The efficiency of the compact antenna device of the present invention may be in the range of about $1/1,000$ and $1/10,000$. The invention enables the use of compact antenna elements at low frequencies while keeping relatively high efficiency. For achieving high efficiency, three requirements are needed: the impedance matching should be reached between the antenna device and the transmission line, the reactance of the antenna device should be substantially cancelled, and the dimension of the antenna device (e.g. radius) should be smaller than the wavelength of operation. The configuration of the antenna device of the present invention fulfils all of these requirements.

The antenna device comprises an integrated matching circuit being implemented by at least one controllable capacitor for a number of frequencies. The at least one controllable resonating capacitor determines a resonance frequency of the antenna device. An object of the invention is to provide a compact antenna device which can obtain a desired matching characteristic without using a separate matching circuit which limits miniaturization of the antenna system as a whole and forms a factor of limiting the efficiency of the antenna and raising cost when the antenna is incorporated into the terminal. The impedance of the antenna device of the present invention may thus be appropriately selected to reach 50 Ohm.

Moreover, the antenna device is not affected by the environment, such as the presence of dielectric material. The electromagnetic field in the near-field region is predominantly magnetic. Therefore, the antenna device is sensitive to permeable media in the near field. If the media is not permeable, the antenna device is not affected by the environment. In this connection, it should be understood that the special configuration of the antenna device enables to generate, under resonance frequency, a radiation pattern having spatial characteristics which are essentially frequency independent. The radiating antenna element is thus configured for generating, under resonance frequency, a radiation pattern having spatial characteristics being essentially frequency independent. The antenna device is magnetically excited and thus indifferent to nearby substance dielectric properties. The magnetic excitation of the antenna device enables to use the antenna device for near-field measurement, for example of a human body. The antenna device does not depend on the environment and can be adjusted as desired by adjusting the capacitance value of the controllable capacitors. In this connection, it should be understood that in a regular antenna the resonance frequency depends on the geometry of the antenna. In the present invention the resonance frequency is fixed by $\omega=1/\sqrt{LC}$ where L is the inductance of the antenna device and C is the capacitance of the controllable capacitor. Due to the controllable capacitor of the antenna device of the present invention, the resonating antenna is easy to tune. The tunability of the resonance frequency of the antenna device of the present invention provides a bandwidth tunability. Therefore the antenna device may be incorporated in small sensors (with large wavelength) to create a system for near field electromagnetic measurements. The antenna device is a transceiver capable of receiving and/or transmitting. The compact antenna device may be used in many industrial fields such as TV/radio infrastructure and user equipment, mobile phones, wireless telecommunications infrastructure and medical applications.

The antenna device of the present invention is a balanced antenna device having a simple structure capable of operating at a single resonance over a range of different frequencies. The antenna device has a single feeding terminal having an integrated balun structure. There is no need to connect the antenna device to an external balun.

The antenna device of the invention may be formed by a single antenna unit or by a plurality of antenna units. In some embodiments, the antenna units are arranged to form an array arranged in a spaced-apart relationship along a linear or a closed loop path. The array may be implemented to form a Multiple Input and Multiple Output (MIMO) system. The antenna device of the present invention uses at a certain given time, one antenna unit as a transmitter and the other antenna units as receivers. In other words, each of the spaced-apart antenna units may be configured and operable as a detector. At a certain given time, one detector is configured and operable as a transmitter radiating a certain electromagnetic radiation, and the other detectors are configured and operable as a receivers receiving the certain electromagnetic radiation.

In particular, the antenna device of the present invention can be arranged in an antenna detector array for treatment of cancer tumors.

In some embodiments, the feeding circuit comprises one or more pair of co-aligned winding coils wrapped in an opposite direction and connected in parallel to each other.

In some embodiments, the radiating antenna element has a certain reactance and the respective capacitor is configured for compensating for the secondary inductance to substantially cancel the reactance at a resonance frequency.

In some embodiments, the radiating antenna element is formed by at least one pair of co-axial first and second winding coils wrapped in an opposite direction and connected in parallel to each other, and comprises at least two controllable first and second resonating capacitors respectively; wherein the first and the second winding coils of the radiating circuit are connected to the ground via the first and second capacitors respectively.

In some embodiments, each of the feeding circuit and the radiating antenna are arranged circumferentially.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 1:
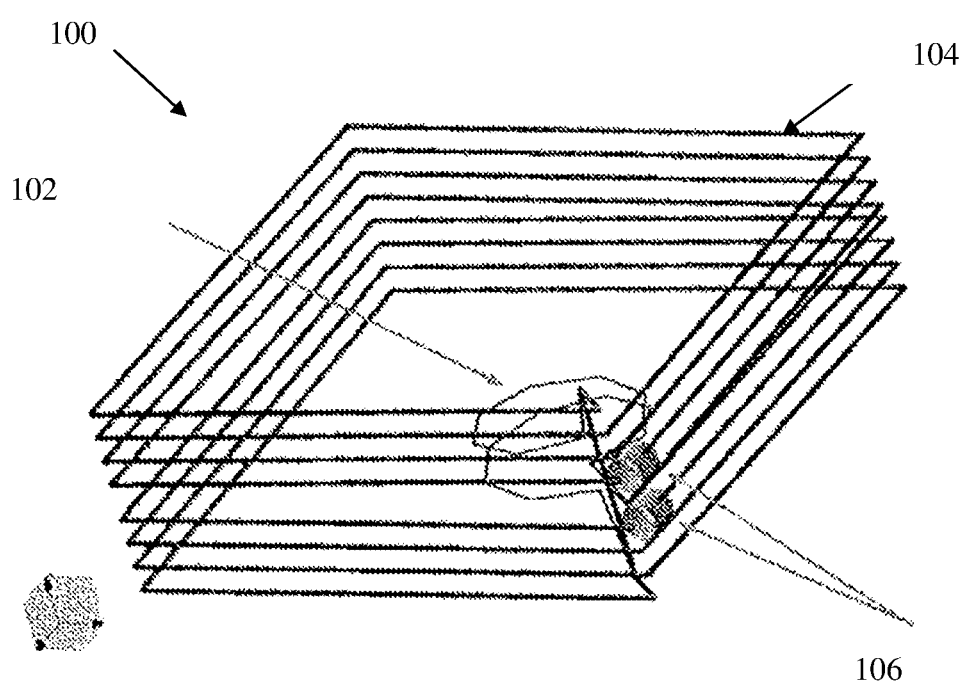
FIG. 1 is a three-dimensional illustration of a possible configuration of the antenna unit according to some embodiments of the present invention.

Reference is made to FIG. 1 showing a three-dimensional illustration of an example of the antenna unit 100 according to some embodiments of the present invention. Magnetic antenna unit 100 comprises a secondary antenna module configured as a radiating antenna element 104 of the antenna unit and a primary module configured as a feeding circuit 102 for the secondary antenna module and comprising one or more feeding sets, each comprising one or more respective winding coils being connected at one end to a feeding port of the antenna device and at the other end to the ground. Radiating antenna element 104 comprises one or more radiating sets, each set comprising serially connected winding coil and respective capacitor 106, whereby each radiating set is connected to the ground from both ends thereof. The antenna device 100 is configured such that the dimensions of the winding coil of the radiating sets and of the feeding sets are significantly smaller than an operational wavelength of the antenna unit, thereby resulting in impedances of the feeding sets being substantially lower than a transmission impedance associated with an impedance of a transmission line to be connected to the feeding port. At least one resonating capacitor 106 is needed for each coil of the radiating antenna element 104. In this connection, it should be understood that the geometrical position of the capacitor 106 in the antenna device as a part of the radiating set, enables to tune the antenna unit at the matched frequency. The fact that the capacitor 106 is a part of the radiating set allows for greater flexibility and control of the radiating antenna element 104, leading to greater tuning capacity. The value of the resonating capacitor may be appropriately adjusted such that the reactance appearing at the terminals of the antenna is substantially cancelled at the resonance frequency of the antenna. More specifically, at the resonance frequency the inductive reactance and the capacitive reactance of the antenna are equal in magnitude, but opposite in influence, and thus cancel out each other, and therefore the impedance is purely resistive. Therefore, at the resonance frequency, the reactance of the secondary antenna module is cancelled by the capacitor. The primary module is configured such that its reactance is negligible by appropriately selecting the geometrical parameters of the primary module (cross-sectional surface, size, number of turns . . . ). The value of the capacitors may be adjusted through switches (not shown). A processor may be equipped with an algorithm which varies depending on its design. The main functions of this algorithm are receiving the operating frequency, controlling switches and adjusting the values of the capacitors so that they converge towards the values leading to tuning.

Figure 2A:
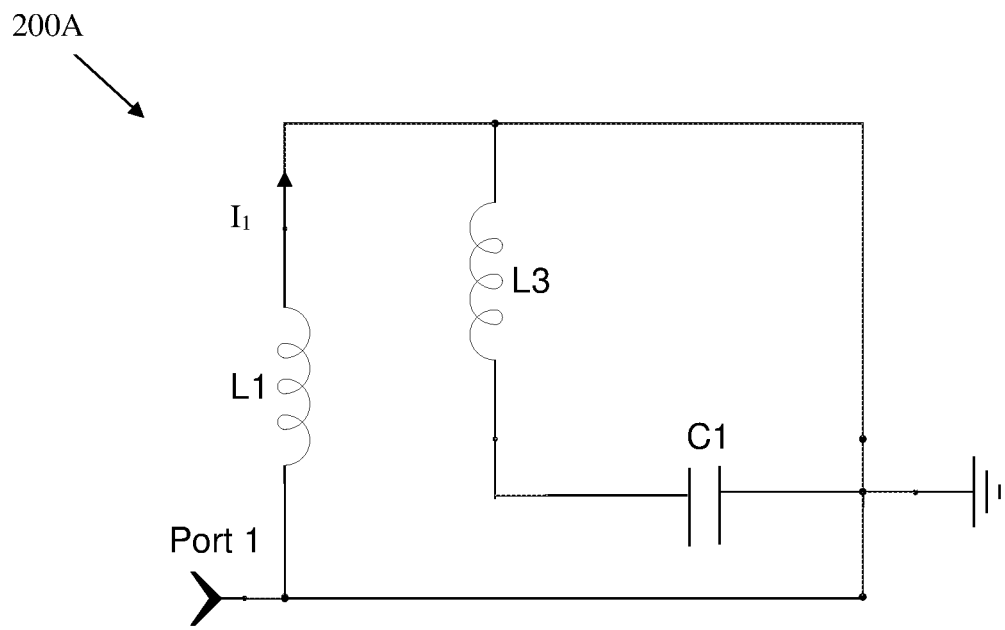
FIG. 2A is an electrical scheme of a possible configuration of an antenna unit of the present invention.

The resistance of the antenna (radiation resistance and Ohmic resistance) matches the impedance of a transmission line (about 50 Ohm) feeding the feeding circuit 102 via a feeding port (illustrated in FIG. 2A). In this connection, it should be understood that the coupling between the primary module to the secondary module is used to increase the real part impedance of the secondary module to about 50 Ohm. This acts in accordance with the principles of a transformer. The primary module "sees" its own impedance plus the reflected impedance (mutual impedance) of the secondary module. The special relations between the coupled coils of the primary and secondary modules (e.g. turns ratio) are responsible for the impedance transformation, and not the inherent impedance of each one of them individually.

Feeding circuit 102 and radiating antenna element 104 are placed in proximity to each other to enable inductive coupling between their respective winding coils. The distance between feeding circuit 102 and radiating antenna element 104 is selected such that the antenna device has an impedance matched to an impedance of a transmission line to be connected to the feeding port. The coils of the feeding circuit 102 define primary winding coils, while the coil(s) of the radiating antenna element 104 define secondary winding coil(s). In the specific and non-limiting example, the winding coils of the primary and secondary modules are arranged such that the winding coil of radiating antenna element 104 at least partially encloses the winding coil of feeding circuit 102, thereby providing that the radiating antenna element 104 is coupled to the feeding circuit 102 for feeding the secondary radiating antenna element 104. In this example, feeding circuit 102 and radiating antenna element 104 have closed-loop configuration co-axially arranged to define a plurality of internal feeding loops and a plurality of external radiating loops. In this non-limiting example, feeding circuit 102 has a square loop shape. However, the invention is not limited to any particular geometrical shape, and the feeding circuit 102 as well as the radiating antenna element 104 may have any shape such as circular, elliptical, rectangular, square, etc. A magnetic induction is thus created by the internal winding coils of the feeding antenna element exciting the external winding coils of the radiating antenna element. A transformer transferring electrical energy is formed between the internal feeding circuit and the external radiating antenna element through magnetic induction. The current in one coil of the feeding circuit produces a magnetic field, which in turn induces a voltage in one coil of the radiating antenna element. The windings coil(s) of the feeding circuit are connected at one end to a common feeding port being connectable to a source via a transmission line, and, at the other end, to the ground. Feeding circuit 102 generates a magnetic field in a direction co-aligned with the winding coil. In this way, feeding circuit 102 is configured and operable as a primary winding generating a magnetic field in one direction. A ratio between the primary and the secondary inductances of the feeding sets and of the radiating sets corresponds to a ratio between impedance of the radiating sets and of the feeding sets. For example, a ratio between the primary and the secondary inductances of the feeding sets and of the radiating sets may be about 1:50 while the ratio between impedance of the radiating sets and of the feeding sets is about 50:1. The number of winding coils of the feeding circuit 102 and of the radiating antenna element 104 may or may not be identical. If the winding coil of the radiating antenna element 104 and of the feeding circuit 102 have a substantially identical cross-sectional surface, a ratio between number of turns of the winding coil of the radiating antenna element 104 and of the feeding circuit 102 corresponds to a ratio between impedance of the radiating sets and of the feeding sets (e.g. 50:1). If the winding coil of the radiating antenna element 104 and of the feeding circuit 102 have different cross-sectional surfaces, a ratio between the number of turns and the surface of the winding coil of the radiating antenna element 104 and of the feeding circuit 102 corresponds to a ratio between impedance of the radiating sets and of the feeding sets (50:1).

In a specific and non-limiting example, the dimension (e.g. radius) of the antenna unit may be in the order of about dozens of centimeters, while wavelength of range operation may be in the order of tens of meters. As described above, the antenna device is thus configured such that the dimensions of the winding coil of the radiating sets and of the feeding sets are significantly smaller than an operational wavelength of the antenna unit. The external cross-section of the antenna unit is the cross-section of the radiating set, and therefore, in a configuration in which the feeding set is enclosed within the radiating set, the feeding set has a smaller dimension than the radiating element. In a specific and non-limiting example, the impedance of the feeding set is in the order of about 0.1 Ohm and the impedance of the winding coil of the radiating element is in the order of about 1 Ohm, thereby resulting in impedances of the feeding sets being substantially lower than a transmission impedance associated with an impedance of a transmission line to be connected to the feeding port (e.g. about 50 Ohms). The capacitor may have a value of about a few tens of PF. The electromagnetic energy has a frequency in a range of about 1 MHz and 20 MHz and a power level of up to a few watts.

Reference is made to FIG. 2A showing a schematic illustration of the electrical circuit of a possible configuration of the antenna unit 200A of the present invention comprising inter alia a feeding circuit formed by one winding coil L1, a radiating antenna element formed by one winding coil L3 and at least one controllable capacitor C1. The radiating antenna element is magnetically (i.e. inductively) coupled to the feeding circuit. The current in the winding coil L1 of the feeding circuit produces a magnetic field, which in turn induces a voltage in the winding coil L3 of the radiating antenna element. The first winding coil L1 of the feeding circuit is connected at one end to a feeding port referred to as Port 1 being connected to a source (not shown) via a transmission line, and at the other end to the ground. The feeding port is connectable to an unbalanced transmission line such as a coaxial cable. When operated, the current $I_1$ passing through coil L1 generates a magnetic field in a certain direction according to the wrapping direction of the coil. In a specific and non-limiting example, the feeding circuit may be a printed circuit. As described above, because of its size, a typical antenna device has an input impedance consisting of large reactance and small radiation resistance. At some frequencies, the antenna device 200A will appear as an inductive reactance, and at others as a capacitive reactance. To cancel the large reactance, the antenna device 200A comprises at least one controllable capacitor C1 having a value defined to cancel the reactance of the antenna device at the resonance frequency. The length of the antenna device determines the input resistance.

Figure 2B:
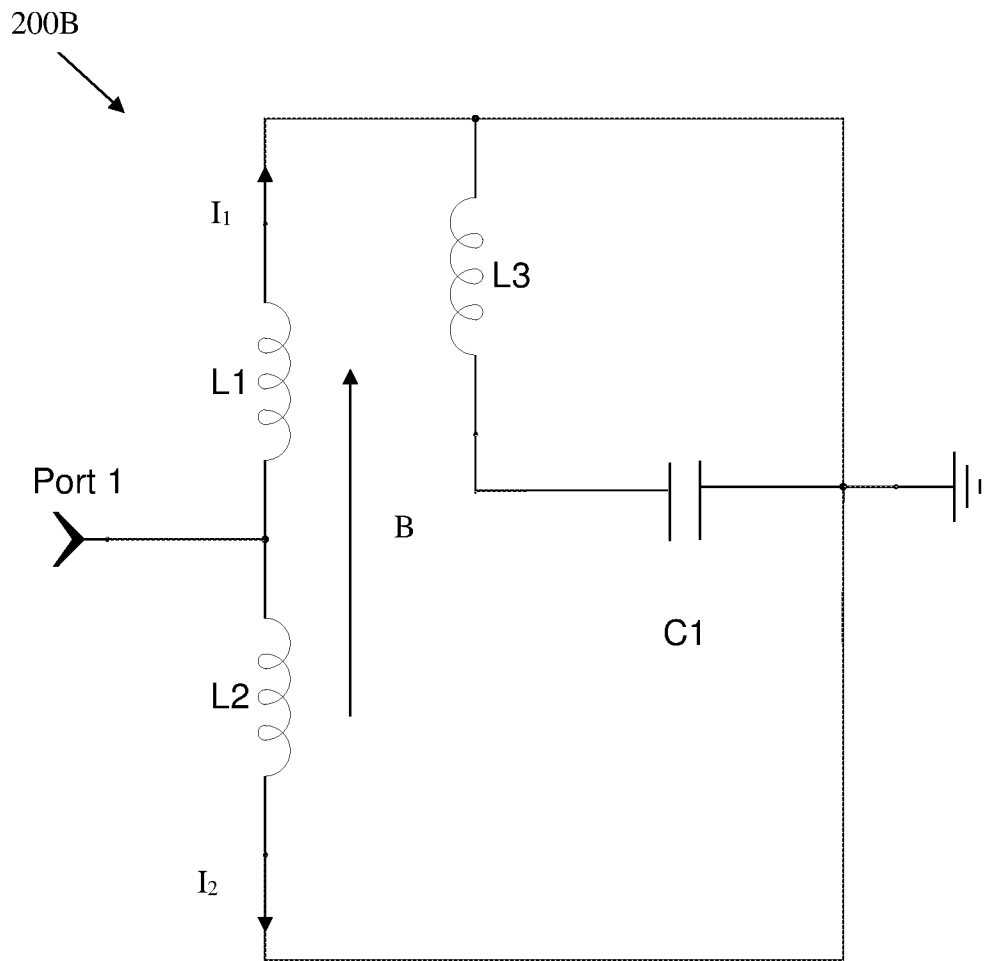
FIG. 2B is an electrical scheme of a possible configuration of an antenna unit of the present invention.

However, it should be noted that parasitic capacitance exists between the individual turns of the winding coils. This winding parasitic capacitance causes the inductor to act as a resonant circuit at some frequency, known as the self-resonant frequency, at which point (and all frequencies above) the component is useless as an inductor. The parasitic capacitance may be thus lower than the efficiency of the antenna of the present invention. To this end, the present invention provides another possible configuration overcoming the parasitic capacitance aspect by providing at least one pair of axial winding coils connected in parallel to each other and being wrapped in an opposite direction. In this connection, reference is made to FIG. 2B showing a schematic illustration of an electrical circuit of another possible configuration of the antenna unit 200B of the present invention comprising inter alia a feeding circuit formed by at least one pair of co-axial winding coils L1 and L2 connected in parallel to each other and being wrapped in an opposite direction, and a radiating antenna element forming one winding coil L3 and one controllable capacitor C1. The winding coil L3 of the radiating antenna element is connected to the ground via controllable capacitor C1. In this configuration, the primary module is symmetric, enabling to reduce the parasitic capacitance of the primary module. By using a symmetric configuration in which each coil generates a magnetic field B in the same direction with respect to each other, the number of turns of each coil may be increased, while maintaining the same self-resonance. Due to the special configuration of the symmetric module, the currents due to the magnetic field B are summed up. The radiating antenna element is inductively coupled to the feeding circuit. The currents in each coil of the at least one pair of coils of the feeding circuit produces a magnetic field B in the same direction, which, in turn induces a voltage in one coil of the radiating antenna element. The first and the second winding coils L1 and L2 of the feeding circuit are connected at one end to an electrically common feeding port, referred to as Port 1 being connected to a source (not shown) via a transmission line, and at the other end to the ground. In other words, both coils L1 and L2 are connected in parallel, i.e. having two common terminal points, one of these terminal points serving as a feeding port, while the other is grounded. The first and the second windings of the feeding circuit are oppositely wrapped such that each coil generates a magnetic field B in the same direction with respect to the other. When operated, the current $I_1$ passing through coil L1 generates a magnetic field B in a certain direction according to the wrapping direction of the coil. The current $I_2$ passing through coil L2 generates a magnetic field B in the same direction because the wrapping direction of the coil is opposite. Therefore, the coils of the feeding circuit generate a magnetic field B summed up in the same direction.

Figure 2C:
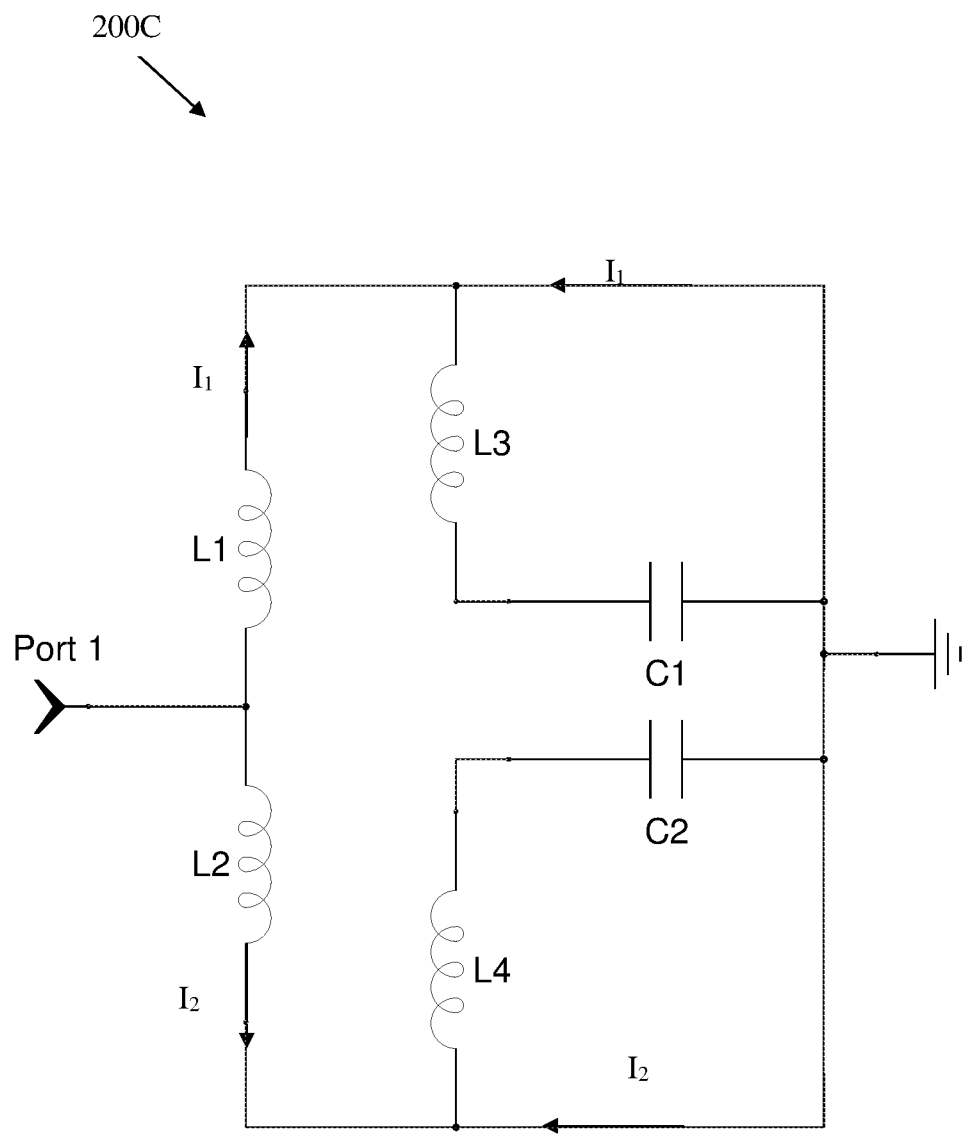
FIG. 2C is another electrical scheme of another possible configuration of an antenna unit of the present invention.

Reference is made to FIG. 2C showing a schematic illustration of an electrical circuit of another possible configuration of the antenna unit 200C of the present invention comprising inter alia a radiating antenna element formed by winding coils L3 and L4 connected in parallel to each other and being wrapped in an opposite direction, and at least two controllable capacitors C1 and C2. In this configuration, the primary and the secondary modules are symmetric, reducing the parasitic capacitance of the radiating antenna element and of the feeding circuit. The antenna device also comprises a feeding circuit formed by at least one pair of axial winding coils L1 and L2 connected in parallel to each other and being wrapped in an opposite direction. The first winding coil L3 of the radiating antenna element is connected to the ground via controllable capacitor C1, and the second winding coil L4 of the radiating antenna element is connected to the ground via controllable capacitor C2.

Although the figures illustrate one pair of winding coils, the invention is not limited to the use of a single pair of winding coils. A plurality of pairs of winding coils, connected in parallel to each other, may be used for the feeding circuit and radiating antenna element, tuning the resonance frequency accordingly. The number of controllable capacitors is also not limited to two and may be selected according to inductance of the coils of the antenna. If more than one capacitor is used for adjusting the resonance frequency value, the capacitors are connected in parallel.

Figure 3:
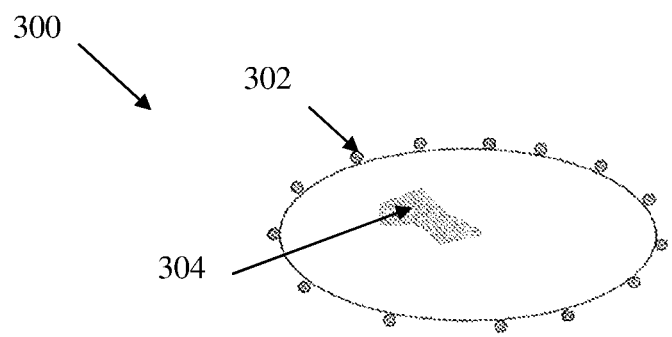
FIG. 3 is a possible arrangement of the antenna device according to some embodiments of the present invention.

Reference is made to FIG. 3 showing a non-limiting example of the antenna device 300 according to some embodiments of the present invention. The antenna device 300 may be implemented as a non-invasive system for imaging internal body tissues (such as MRI). For example, the antenna device 300 may be configured as a detector array for imaging cancer tumors in living tissue. It should be noted that generally an electromagnetic field in the near-field region is predominantly magnetic. The antenna device is sensitive to permeable media in the near field. If the medium is not permeable, the antenna is not affected by the environment. Therefore, the radiating antenna element is configured for generating, under resonance frequency, a radiation pattern having spatial characteristics being essentially frequency independent. The antenna may be positioned on living tissue. Because the antenna is not affected by its surroundings, it is electrically screened. Antenna 300 may thus comprise a plurality of transmitting\receiving elements 302 being placed on the skin with some typical spacing between the elements. Malignant tissue with a typical size of a few millimeters may thus be detected. The mapping distance, that is the distance for which the tissue mapping is valid, may be in the order of ten centimeters for an operation frequency of a typical wavelength of about 3 cm inside the tissue. Given that the ratio between tissue and free-space wavelength is approximately 10 (this ratio is proportional to square root of the permittivity inside the tissue, $\sqrt{\epsilon}$), the operating frequency is in the vicinity of about 1 GHz. Therefore the size of each element is in the order of 1 cm, and a typical distance between elements is about 5 cm. The transmitting power is set by the attenuation inside the living tissue. A simplified model of the living tissue suggests that the maximum two-way attenuation across 10 cm is −100 dB. The antenna device can detect a signal with a minimum power of a pW, therefore the transmitting power does not exceed 10 dBm. The signals emitted by the antenna device are representative of the material properties of the media 304 positioned in the vicinity of the antenna device (e.g. impedance of the media or attenuation and phase constants of the media). In this specific and non-limiting example, the plurality of the antenna units represented in the figure as dots are arranged in a closed-loop configuration. Each antenna unit may be a transmitter or a receiver. One antenna unit 302 may be configured for transmitting a signal to the media at any given time, and the other antenna unit may be configured for receiving the signal from the media. In other words, at a given time, only one of the elements is in a transmitting mode, while the others are in receiving mode. The gathered data is analyzed and transformed into an image of the dielectric constant of the volume under investigation. The received signal is processed to obtain an image of the media. The antenna may also be implemented as a high frequency (HF) transceiver antenna having a length of 50-60 meters and transmitting in the range of about 2-30 MHz. It may be implemented as an amplifier receiver. The antenna has dimensions of a standard mobile communication device. The antenna may be used for a Frequency-hopping spread spectrum (FHSS), in which radio signals are transmitted by rapidly switching a carrier among many frequency channels, using a pseudorandom sequence known to both transmitter and receiver.

The invention claimed is:

1. A magnetic antenna device, comprising:
at least one magnetic antenna unit; wherein the at least one magnetic antenna unit comprises:
a secondary module having a secondary inductance configured as a radiating antenna element of said at least one magnetic antenna unit, the secondary module comprising one or more radiating sets each of which includes a serially connected winding coil and respective controllable capacitor, wherein each of the one or more radiating sets is connected to ground from both ends thereof;
a primary module having a primary inductance configured as a feeding circuit for said secondary module, the primary module comprising one or more feeding sets each of which includes a respective winding coil being connected at one end to a feeding port of the magnetic antenna device, and at the other end, to the ground, such said primary module generates a magnetic field in a direction co-aligned with said serially connected winding coil of the secondary module; thereby providing that said primary module is coupled to said secondary module for feeding said secondary module;
wherein a ratio between the primary and the secondary inductances of said one or more feeding sets and of said one or more radiating sets corresponds to a ratio between impedances of the one or more radiating sets and of said one or more feeding sets; and
wherein the serially connected winding coil of said secondary module and the respective winding coils of the primary module are arranged such that said magnetic antenna device has an impedance matched to an impedance of a transmission line to be connected to said feeding port.

2. The magnetic antenna device of claim 1, wherein dimensions of the winding coil of said one or more radiating sets and of said one or more feeding sets are significantly smaller than an operational wavelength of the at least one magnetic antenna unit, thereby resulting in impedances of said one or more feeding sets being substantially lower than a transmission impedance associated with an impedance of a transmission line to be connected to said feeding port.

3. The magnetic antenna device of claim 2, wherein said winding coil of said one or more radiating sets and of said one or more feeding sets have a substantially identical cross-sectional surface and a ratio between impedances of the one or more radiating sets and of said one or more feeding sets corresponds to a square of a number of turns of said winding coil of said one or more radiating sets and of said one or more feeding sets ratio.

4. The magnetic antenna device of claim 2, wherein said winding coil of said one or more radiating sets and of said one or more feeding sets have different cross-sectional surfaces and a ratio between impedances of the radiating sets and of said one or more feeding sets corresponds to a square of a number of turns factored by the surface ratio of said winding coil of said one or more radiating sets and of said one or more feeding sets ratio.

5. The magnetic antenna device of claim 1, wherein a distance between said primary module and said secondary module is selected such that said magnetic antenna device has an impedance matched to an impedance of a transmission line to be connected to said feeding port.

6. The magnetic antenna device of claim 1, wherein said feeding circuit comprises one or more pair of co-aligned winding coils wrapped in an opposite direction and connected in parallel to each other.

7. The magnetic antenna device of claim 1, wherein said radiating antenna element has a certain reactance and said respective controllable capacitor is configured for compensating for said secondary inductance to substantially cancel said certain reactance at a resonance frequency.

8. The magnetic antenna device of claim 1, wherein said radiating antenna element is formed by at least one pair of co-axial first and second winding coils wrapped in an opposite direction and connected in parallel to each other, said radiating antenna element comprising at least two controllable first and second resonating capacitors respectively; wherein the first and the second winding coils of the radiating antenna element are connected to said ground via the first and second resonating capacitors respectively.

9. The magnetic antenna device of claim 1, wherein each of said feeding circuit and said radiating antenna element are arranged circumferentially.

10. The magnetic antenna device of claim 1, wherein the at least one magnetic antenna unit has a dimension of about $\lambda/100$ where $\lambda$ corresponds to a wavelength of operation.

11. The magnetic antenna device of claim 1, further comprising a plurality of spaced-apart antenna units arranged to form an array.

12. The magnetic antenna device of claim 11, wherein each of said plurality of spaced-apart antenna units is configured and operable as a detector; wherein at a certain time one detector is configured and operable as a transmitter radiating a certain electromagnetic radiation and the other detectors are configured and operable as receivers receiving the certain electromagnetic radiation.

13. The magnetic antenna device of claim 1, wherein said radiating antenna element is configured for generating, under resonance frequency, a radiation pattern having spatial characteristics being essentially frequency independent.

14. The magnetic antenna device of claim 1, wherein said at least one controllable resonating capacitor determines a resonance frequency of the magnetic antenna device.

* * * * *